United States Patent
Gu

(10) Patent No.: US 10,192,483 B2
(45) Date of Patent: Jan. 29, 2019

(54) INTEGRATED ORGANIC LIGHT EMITTING DIODE DISPLAY APPARATUS AND METHODS FOR MAKING THE SAME

(71) Applicant: Viewtrix Technology Co., Ltd., Shanghai (CN)

(72) Inventor: Jing Gu, Shanghai (CN)

(73) Assignee: Viewtrix Technology Co., Ltd., Shanghai (CN)

( * ) Notice: Subject to any disclaimer, the term of this patent is extended or adjusted under 35 U.S.C. 154(b) by 0 days.

(21) Appl. No.: 15/306,976

(22) PCT Filed: May 11, 2016

(86) PCT No.: PCT/CN2016/081776
§ 371 (c)(1),
(2) Date: Oct. 26, 2016

(87) PCT Pub. No.: WO2017/193316
PCT Pub. Date: Nov. 16, 2017

(65) Prior Publication Data
US 2018/0211596 A1    Jul. 26, 2018

(51) Int. Cl.
*H01L 27/32*    (2006.01)
*H01L 51/52*    (2006.01)
(Continued)

(52) U.S. Cl.
CPC ......... *G09G 3/3258* (2013.01); *G09G 3/3208* (2013.01); *G09G 3/3233* (2013.01);
(Continued)

(58) Field of Classification Search
CPC .......... G09G 3/3258; G09G 2310/0264; H01L 27/3244; H01L 51/52
See application file for complete search history.

(56) References Cited

U.S. PATENT DOCUMENTS 6,297,842 B1 * 10/2001 Koizumi ................ B41J 2/45
257/88
2011/0025659 A1 * 2/2011 Kwak ................ G09G 3/3233
345/205
(Continued)

FOREIGN PATENT DOCUMENTS

CN    103985736 A    8/2014
CN    104143561 A    11/2014
(Continued)

OTHER PUBLICATIONS

English-language Abstract of Chinese Patent Publication No. CN 204204861 U.
(Continued)

*Primary Examiner* — Charles V Hicks
(74) *Attorney, Agent, or Firm* — Bayes PLLC

(57) ABSTRACT

Provided are integrated organic light emitting diode (OLED) display apparatus and methods for making the same. In one example, the apparatus includes driving logic on a first substrate of a first die, a plurality of pixel circuits on a second substrate of a second die, and a plurality of OLEDs above the plurality of pixel circuits. The first substrate is made of single-crystal silicon or a compound semiconductor. The second substrate is made of single-crystal silicon or a compound semiconductor. Each OLED corresponds to a respective one of the plurality of pixel circuits. The second die having the plurality of pixel circuits and OLEDs is mounted on the first die having the driving logic. Each pixel circuit is electrically connected to the driving logic through at least one of a plurality of vertical interconnect accesses (vias) penetrating the second substrate of the second die.

30 Claims, 12 Drawing Sheets

(51) Int. Cl.
    *G09G 3/3208*      (2016.01)
    *G09G 3/3233*      (2016.01)
    *G09G 3/3258*      (2016.01)

(52) U.S. Cl.
    CPC ...... *H01L 27/3244* (2013.01); *H01L 27/3251* (2013.01); *H01L 51/52* (2013.01); *G09G 2310/0264* (2013.01)

(56) References Cited

U.S. PATENT DOCUMENTS

| | | | |
|---|---|---|---|
| 2011/0102697 A1* | 5/2011 | Koyama | G02F 1/13454 349/43 |
| 2014/0332769 A1 | 11/2014 | Lee et al. | |
| 2016/0268361 A1 | 9/2016 | Wang et al. | |

FOREIGN PATENT DOCUMENTS

| | | |
|---|---|---|
| CN | 204204861 U | 3/2015 |
| CN | 105161052 A | 12/2015 |

OTHER PUBLICATIONS

English-language Abstract of Chinese Patent Publication No. CN 105161052 A.

International Search Report and Written Opinion directed to International Patent Application No. PCT/CN2016/081776, dated Feb. 6, 2017; 9 pages.

\* cited by examiner

INTEGRATED ORGANIC LIGHT EMITTING DIODE DISPLAY APPARATUS AND METHODS FOR MAKING THE SAME

BACKGROUND

The disclosure relates generally to displays, and more particularly, to organic light emitting diode (OLED) display apparatus and methods for making the same.

OLED, a self-light-emitting device, is emerging as a next-generation display because it does not require a backlight and has a high contrast, wide-viewing angle, fast response time, and low power consumption. The driving circuits of OLED display devices are usually fabricated on glass substrates using photolithography techniques. For conventional displays, such as television and mobile devices, low temperature polysilicon (LTPS) deposited on glass substrates is usually used as the channel material of thin file transistors (TFTs) in the driving circuits. Due to the limit of feature size for fabricating TFTs on glass substrates (e.g., the minimum line width is about 2-3 μm) and the relatively low mobility of LTPS, it is difficult to increase the pixel density of conventional displays, such as to more than 1,000 PPI for LTPS-based displays.

However, in some emerging technology areas, such as virtual reality (VR) and augmented reality (AR), displays with high pixel densities (e.g., above 2,000 PPI) and fast response time are desirable because the VR/AR headsets are close to human eyes and the pixels are usually enlarged by lenses. Thus, conventional liquid crystal displays (LCDs) and OLED displays using LTPS on glass substrates are not suitable for applications such as VR and AR. Accordingly, there exists a need for improved display apparatus and method for making the display apparatus to solve the above-mentioned problems.

SUMMARY

The disclosure relates generally to displays, and more particularly, to OLED display apparatus and methods for making the same.

In one example, a method is provided for making a display device. Driving logic is formed on a first substrate of a first die. The first substrate is made of single-crystal silicon or a compound semiconductor. A plurality of pixel circuits are formed on a second substrate of a second die. The second substrate is made of single-crystal silicon or a compound semiconductor. A plurality of OLEDs are formed above the plurality of pixel circuits. Each of the plurality of OLEDs corresponds to a respective one of the plurality of pixel circuits. The second die having the plurality of pixel circuits and OLEDs is mounted on the first die having the driving logic. Each of the plurality of pixel circuits is electrically connected to the driving logic through at least one of a plurality of vertical interconnect accesses (vias) penetrating the second substrate of the second die.

In another example, an apparatus includes driving logic on a first substrate of a first die, a plurality of pixel circuits on a second substrate of a second die, and a plurality of OLEDs above the plurality of pixel circuits. The first substrate is made of single-crystal silicon or a compound semiconductor. The second substrate is made of single-crystal silicon or a compound semiconductor. Each of the plurality of OLEDs corresponds to a respective one of the plurality of pixel circuits. The second die having the plurality of pixel circuits and OLEDs is mounted on the first die having the driving logic. Each of the plurality of pixel circuits is electrically connected to the driving logic through at least one of a plurality of vias penetrating the second substrate of the second die.

In still another example, a method is provided for making a display device. Driving logic is formed on a first substrate. The first substrate is made of single-crystal silicon or a compound semiconductor. A plurality of pixel circuits are formed above the driving logic. Each of the plurality of pixel circuits is electrically connected to the driving logic through at least one of a plurality of vias. A plurality of OLEDs are formed above the plurality of pixel circuits. Each of the plurality of OLEDs corresponds to a respective one of the plurality of pixel circuits.

In yet another example, an apparatus includes driving logic on a first substrate, a plurality of pixel circuits above the driving logic, and a plurality of OLEDs above the plurality of pixel circuits. The first substrate is made of single-crystal silicon or a compound semiconductor. Each of the plurality of pixel circuits is electrically connected to the driving logic through at least one of a plurality of vias. Each of the plurality of OLEDs corresponds to a respective one of the plurality of pixel circuits.

In yet another example, a method is provided for making a display device. Driving logic and a plurality of pixel circuits are formed in a same layer on a substrate. The substrate is made of single-crystal silicon or a compound semiconductor. A plurality of OLEDs are formed above the layer in which the driving logic and the plurality of pixel circuits are formed. Each of the plurality of OLEDs corresponds to a respective one of the plurality of pixel circuits.

In yet another example, an apparatus includes driving logic and a plurality of pixel circuits in a same layer on a substrate and a plurality of OLEDs above the layer in which the driving logic and the plurality of pixel circuits are formed. The substrate is made of single-crystal silicon or a compound semiconductor. Each of the plurality of OLEDs corresponds to a respective one of the plurality of pixel circuits.

BRIEF DESCRIPTION OF THE DRAWINGS

The embodiments will be more readily understood in view of the following description when accompanied by the below figures and wherein like reference numerals represent like elements, wherein.

DETAILED DESCRIPTION

Figure 1:
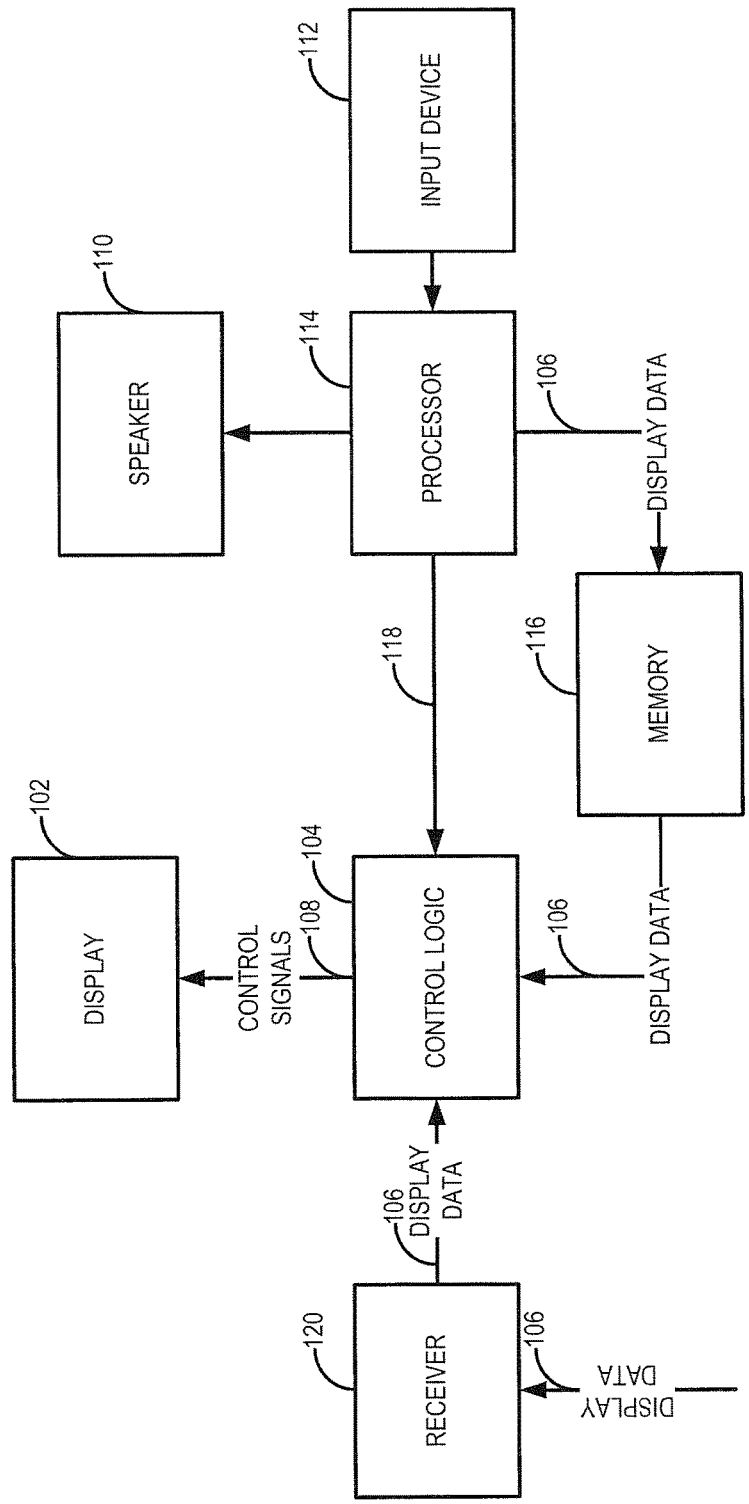
FIG. 1 is a block diagram illustrating an apparatus including a display and control logic in accordance with one embodiment set forth in the present disclosure.

In the following detailed description, numerous specific details are set forth by way of examples in order to provide a thorough understanding of the relevant disclosures. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure.

Throughout the specification and claims, terms may have nuanced meanings suggested or implied in context beyond an explicitly stated meaning. Likewise, the phrase "in one embodiment/example" as used herein does not necessarily refer to the same embodiment and the phrase "in another embodiment/example" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the teuii "based on" may be understood as not necessarily intended to convey an exclusive set of factors and may, instead, allow for existence of additional factors not necessarily expressly described, again, depending at least in part on context.

As will be disclosed in detail below, among other novel features, the novel display apparatus in the present disclosure provides the ability to increase the display density by applying high mobility materials (e.g., single-crystal silicon or gallium arsenide (GaAs)) as the substrate material. For example, by applying standard complementary metal-oxide semiconductor (CMOS) fabrication process on single-crystal silicon substrates, individual pixel size can be reduced, thereby increasing the display dentistry to over 2,000 PPI. On the other hand, because the display resolution (i.e., the total number of pixels) remains the same, the novel display apparatus in the present disclosure would not increase the burden on image processing. Further, the high mobility of single-crystal silicon or compound semiconductor substrate material (e.g., GaAs) can decrease the gate scan time, thereby increasing the refresh rate. Moreover, the novel display apparatus can integrate OLEDs, driving logic, control logic, and graphic processing unit (GPU) into a single device, which can reduce the connection wires and decrease the size and power consumption of the device.

Additional novel features will be set forth in part in the description which follows, and in part will become apparent to those skilled in the art upon examination of the following and the accompanying drawings or may be learned by production or operation of the examples. The novel features of the present disclosure may be realized and attained by practice or use of various aspects of the methodologies, instrumentalities, and combinations set forth in the detailed examples discussed below.

FIG. 1 illustrates an apparatus 100 including a display 102 and control logic 104. The apparatus 100 may be any suitable device, for example, a VR/AR device (e.g., a VR/AR headset), handheld device (e.g., dumb or smart phone, tablet, etc.), wearable device (e.g., eyeglasses, wrist watch, etc.), automobile control station, gaming console, television set, laptop computer, desktop computer, netbook computer, media center, set-top box, global positioning system (GPS), electronic billboard, electronic sign, printer, or any other suitable device. In this example, the display 102 is operatively coupled to the control logic 104 and is part of the apparatus 100, such as but not limited to, a head-mounted display, computer monitor, television screen, dashboard, electronic billboard, or electronic sign. The display 102 may be an OLED display.

The control logic 104 may be any suitable hardware, software, firmware, or combination thereof, configured to receive display data 106 and render the received display data 106 into control signals 108 for driving the subpixels on the display 102. The control signals 108 are used for controlling writing of data to the subpixels and directing operations of the display 102. For example, subpixel rendering algorithms for various subpixel arrangements may be part of the control logic 104 or implemented by the control logic 104. The control logic 104 in one example may include a timing controller (TCON), an interface, and a power supply circuit (e.g., a DC/DC power converter). The control logic 104 may be implemented as a standalone integrated circuit (IC) chip, such as an application-specific integrated circuit (ASIC) or a field-programmable gate array (FPGA). The apparatus 100 may also include any other suitable component such as, but not limited to, a speaker 110 and an input device 112, e.g., a mouse, keyboard, remote controller, handwriting device, camera, sensors, microphone, scanner, etc.

In one example, the apparatus 100 may be a laptop or desktop computer having a display 102. In this example, the apparatus 100 also includes a processor 114 and memory 116. The processor 114 may be, for example, a graphic processor (e.g., GPU), a general processor (e.g., APU, accelerated processing unit; GPGPU, general-purpose computing on GPU), or any other suitable processor. The memory 116 may be, for example, a discrete frame buffer or a unified memory. The processor 114 is configured to generate display data 106 in display frames and temporally store the display data 106 in the memory 116 before sending it to the control logic 104. The processor 114 may also generate other data, such as but not limited to, control instructions 118 or test signals, and provide them to the control logic 104 directly or through the memory 116. The control logic 104 then receives the display data 106 from the memory 116 or from the processor 114 directly.

In another example, the apparatus 100 may be a television set having a display 102. In this example, the apparatus 100 also includes a receiver 120, such as but not limited to, an antenna, radio frequency receiver, digital signal tuner, digital display connectors, e.g., HDMI, DVI, DisplayPort (DP), USB, Bluetooth, WiFi receiver, or Ethernet port. The receiver 120 is configured to receive the display data 106 as an input of the apparatus 100 and provide the native or modulated display data 106 to the control logic 104.

In still another example, the apparatus 100 may be a VR/AR device or a handheld device, such as a VR/AR headset, VR/AR glasses, a smart phone, or a tablet. In this example, the apparatus 100 includes the processor 114, memory 116, and the receiver 120. The apparatus 100 may both generate display data 106 by the processor 114 and receive display data 106 through the receiver 120. For example, the apparatus 100 may be a VR/AR device or handheld device that works as both a mobile television and a mobile computing device. In any event, the apparatus 100 at least includes the display 102 and control logic 104 as described below in detail.

Figure 2A:
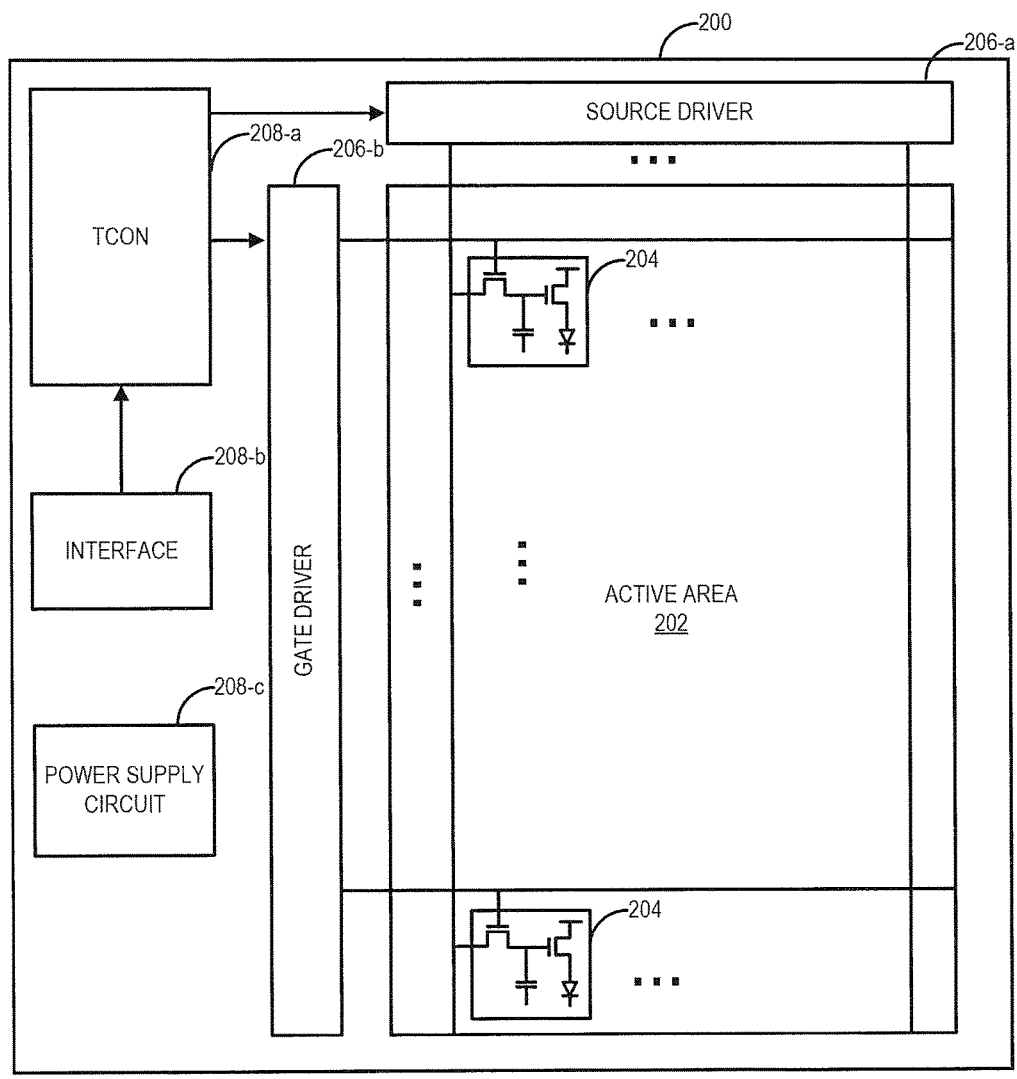
FIGS. 2A-2B are block diagrams illustrating various examples of an integrated OLED display apparatus in accordance with various embodiments set forth in the present disclosure.
Figure 2B:
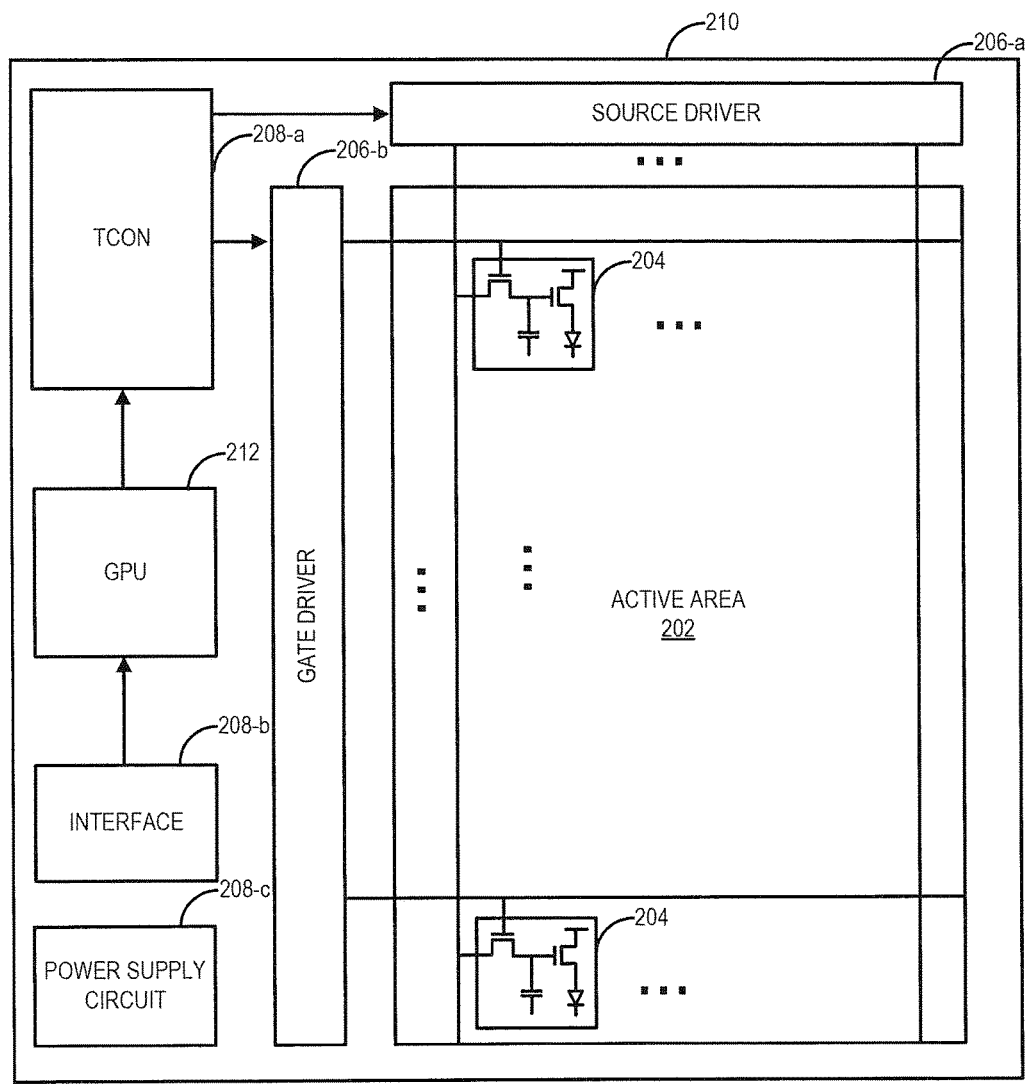

FIGS. 2A-2B are block diagrams illustrating various examples of an integrated OLED display apparatus in accordance with various embodiments set forth in the present disclosure. In one embodiment as shown in FIG. 2A, an integrated OLED display apparatus 200 includes an active area 202 having an array of subpixels 204, driving logic 206, and control logic 208. Each subpixel 204 may include an OLED and a pixel circuit for driving the OLED. Each OLED can emit a light in a predetermined brightness and color, such as but not limited to, red, green, blue, yellow, cyan, magenta, or white. Each pixel circuit includes one or more TFTs and is configured to drive the corresponding subpixel 204 by controlling the light emitting from the respective OLED according to the control signals from the driving and control logic 206, 208. In this example, the pixel circuit may be in a 2T1C configuration as shown in FIG. 2A (i.e., including a switching transistor, a driving transistor, and a storage capacitor). It is understood that in other examples, the pixel circuit may include a compensation circuit with more transistors and/or capacitors for brightness uniformity, such as in a 7T1C, 5T1C, 5T2C, or 6T1C configuration as known in the art.

The interface 208-b may be any serial or parallel data interface, such as but not limited to, TTL, CMOS, RS-232, SPI, I²C, MIMP, eDP, 180/M68 series MCU interface, etc. The interface 208-b in this example is configured to receive display data in multiple frames and any other control instructions or test signals. The TCON 208-a then receives the display data in multiple frames via the interface 208-b. The display data may be received in consecutive frames at any frame rate used in the art, such as 30, 60, or 72 Hz. Based on the received display data, the TCON 208-a provides control signals to a source driver 206-a and a gate driver 206-b, respectively. The gate driver 206-b in this example applies scan voltage signals, which are generated based on the control signals from the TCON 208-a, to the gate lines (a.k.a. scan lines) for each row of subpixels 204 in a sequence. The gate driving signals are applied to the gate electrode of each switching TFT to turn on the corresponding switching TFT by applying a gate voltage so that the data for the corresponding subpixel 204 can be written by the source driver 206-a. The gate driver 206-b in this example may include a digital-analog converter (DAC) and multiplexers (MUX) for converting the digital control signals to analog scan voltage signals and applying the scan voltage signals to the scan lines for each row of subpixels 204 according to the preset scanning sequences. It is understood that although one gate driver 206-b is illustrated in FIG. 2A, in other examples, multiple gate drivers may work in conjunction with each other to scan the subpixel rows.

The source driver 206-a in this example is configured to write the display data into the array of subpixels 204 based on the control signals from the TCON 208-a in each frame. For example, the source driver 206-a may simultaneously apply the source voltage signals to the source lines (a.k.a. data lines) for each column of subpixels 204. That is, the source driver 206-a may include a DAC, MUX, and arithmetic circuit for controlling, based on the control signals, a timing for applying voltage to the source electrode of each switching TFT and a magnitude of the applied voltage according to gradations of the display data. It is understood that although one source driver 206-a is illustrated in FIG. 2A, in other examples, multiple source drivers may work in conjunction with each other to apply source voltage signals to the data lines for each column of subpixels 204.

In this example, the power supply circuit 208-c includes any suitable circuit for proving power to the integrated OLED display apparatus 200, such as but not limited to a DC/DC power converter. The integrated OLED display apparatus 200 may include any other suitable components, such as a clock signal generator, an encoder, a decoder, one or more processors, controllers, and storage devices. For example, in another embodiment shown in FIG. 2B, an integrated OLED display apparatus 210 further includes a GPU 212 for generating display data. The GPU 212 may be operatively coupled to an external processor (e.g., a central processing unit (CPU)) via the interface 208-b. As will be described below in detail with respect to FIGS. 3-8, the integrated OLED display apparatus 200, 210 is a display system having light emitting elements (e.g., OLEDs), pixel circuits, driving logic, control logic, and/or GPU that are integrated on the same single-crystal silicon or compound semiconductor (e.g., GaAs) substrate.

Figure 3:
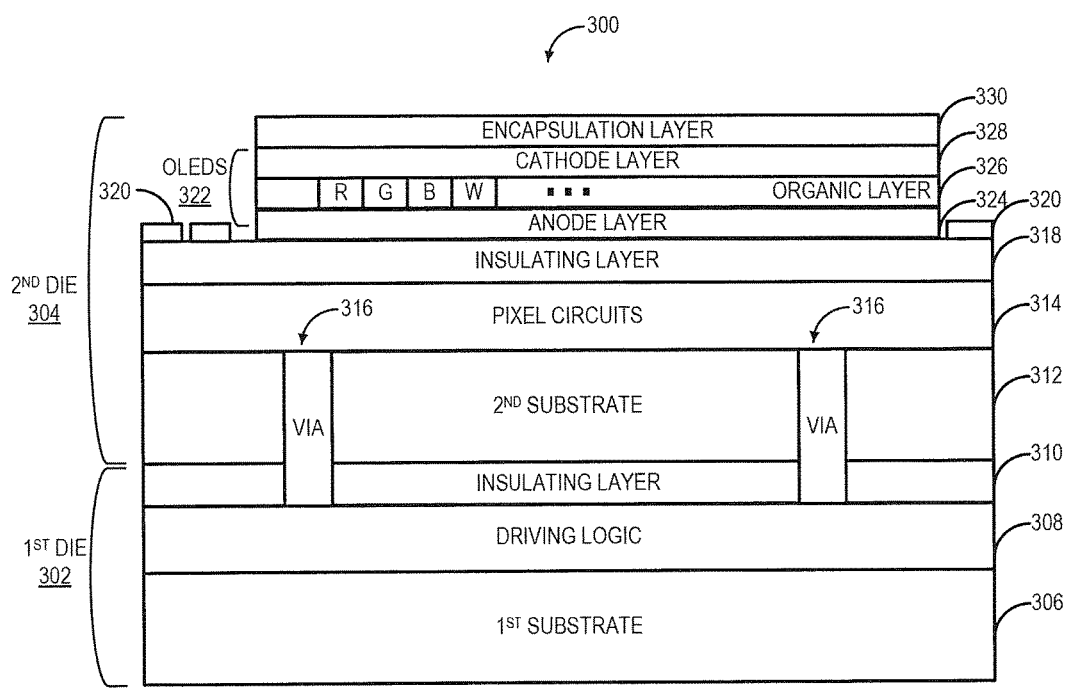
FIG. 3 is a side-view diagram illustrating one example of an integrated OLED display apparatus in accordance with one embodiment set forth in the present disclosure.

FIG. 3 is a side-view diagram illustrating one example of an integrated OLED display apparatus 300 in accordance with one embodiment set forth in the present disclosure. The integrated OLED display apparatus 300 in this example includes a first die 302 and a second die 304 mounted on the first die 302. The first die 302 includes a first substrate 306, driving logic 308 on the first substrate 306, and an insulating layer 310 on the layer in which the driving logic 308 is formed. The first substrate 306 may be made of single-crystal silicon (e.g., a bulk Si substrate or a silicon-on-insulator (SOI) substrate) or compound semiconductor material (e.g., GaAs), which has a higher mobility compared with a LTPS material. The driving logic 308 may be the same driving logic 206 as described above in FIG. 2. In some embodiments, control logic 208 and/or a GPU 212 may be formed in the same layer in which the driving logic 308 is formed on the first substrate 306. The driving logic 308, control logic 208, and GPU 212 may include multiple sub-layers to achieve their functions as known in the art. In one example, the first substrate 306 may be a single-crystal silicon substrate, and the driving logic 308, control logic 208, and GPU 212 may be fabricated using the standard CMOS process including conventional UV lithography or next-generation lithography techniques such as extreme UV lithograph, electron beam lithography, X-ray lithography, etc. For example, the semiconductor feature size of the driving logic 308, control logic 208, and GPU 212 may be below 1 μm, such as 110 nm, 90 nm, 65 nm, 45 nm, 28 nm, 14 nm, 7 nm, etc. In this example, the insulating layer 310 covers the driving logic 308 to provide electrical insulation and protection for he driving logic 308 and may be made of silicon oxide ($SiO_2$) or silicon nitride ($Si_3N_4$). It is understood that the insulating layer 310 may be made of any other suitable materials when the material of the first substrate 306 is other than single-crystal silicon.

The second die 304 includes a second substrate 312, pixel circuits 314 on the second substrate 312, an insulating layer 318 on the layer in which the pixel circuits 314 are formed, OLEDs 322 on the insulating layer 318, and an encapsulation layer 330 on the OLEDs 322, The second substrate 312 may be made of single-crystal silicon (e.g., a bulk Si substrate or a SOI substrate) or compound semiconductor material (e.g., GaAs), which has a higher mobility compared with LTPS material. The first and second substrates 306, 312 may be made of the same material or different materials. The pixel circuits 314 are described above in FIG. 2 and includes multiple sub-layers to achieve their functions as known in the art. In one example, the second substrate 312 may be a single-crystal silicon substrate, and the pixel circuits 314 may be fabricated using the standard CMOS process including conventional UV lithography or next-generation lithography techniques such as extreme UV lithograph, electron beam lithography, X-ray lithography, etc. For example, the semiconductor feature size of the pixel circuits 314 may be below 1 μm, such as 110 nm, 90 nm, 65 nm, 45 nm, 28 nm, 14 nm, 7 nm, etc. In another example, the pixel circuits 314 may be fabricated using the conventional TFT process for making TFTs on glass substrates, and the semiconductor feature size of the pixel circuits 314 may be above 1 μm. As the pixel circuits 314 and driving logic 308 (and control logic 208 or GPU 212) are formed on the different substrates in different dies, they can be fabricated using the same fabrication process or different fabrication processes, and/or under the same or different semiconductor feature sizes. In one example, the semiconductor feature size for fabricating the driving logic 308 (and control logic 208 or GPU 212) on the first substrate 306 is smaller than the semiconductor feature size for fabricating the pixel circuits 314 on the second substrate 312.

In this example, the insulating layer 318 covers the pixel circuits 314 to provide electrical insulation and protection for the pixel circuits 314 and may be made of $SiO_2$ or $Si_3N_4$. It is understood that the insulating layer 318 may be made of any other suitable materials when the material of the second substrate 312 is other than single-crystal silicon. OLEDs 322 may be formed in a sandwich structure having an anode layer 324, an organic layer 326, and a cathode layer 328, as known in the art. Each OLED 322 corresponds to a respective pixel circuit 314 as described above in FIG. 2. The anode layer 324 may be formed on the insulating layer 318. The anode for each OLED 322 may be patterned by lithography process. The organic layer 326 may be Ruined on the anode layer 324 and patterned for each OLED 322 by evaporation techniques using fine metal masks (FMMs). Depending on the characteristics (e.g., material, structure, etc.) of the organic layer 326 of each OLED 322, the OLED 322 may present a distinct color and brightness. The cathode layer 328 may be formed on the organic layer 326. The cathode for each OLED 322 may be patterned by lithography process. In this example, the OLEDs 322 are top-emitting OLEDs, and the cathode layer 328 may be made of indium tin oxide (ITO). In this example, each OLED 322 is in a distinct color (e.g., red, green, blue, and white). In some embodiments, other OLED configurations may be applied. In one example, each OLED 322 may be in the same white color, and the color of each individual subpixel is defined by another layer of color filters in different colors (not shown). In another example, each OLED 322 may be in the same blue color, and the color of each individual subpixel is defined by another layer of transfer color filters in different colors (not shown).

In this example, the second die 304 having the pixel circuits 314 and OLEDs 322 is mounted on the first die 302 having the driving logic 308. For example, the backside of the second die 304 may be thermally bonded to the front side of the first die 302. Each pixel circuit 314 in the second die 304 may be electrically connected to the driving logic 308 in the first die 302 through at least one of a plurality of vertical interconnect accesses (vias) 316 penetrating the second substrate 312 of the second die 304. In one example in which the second substrate 312 is made of single-crystal silicon, through-silicon vias (TSVs) may be used for electrically connecting the pixel circuits 314 and the driving logic 308 in different dies. In this example, the encapsulation layer 330 is formed on the OLEDs 322 to protect the OLEDs 322 after packaging. Contact pads 320 may be formed on the insulating layer 318 and electrically connected to the internal electrical components of the integrated OLED display apparatus 300, such as the pixel circuits 314 and driving logic 308, through vias (not shown).

In the example shown in FIG. 3, because the driving logic 308 and the pixel circuits 314 can be fabricated separately on different wafers, the manufacturing yield can be improved by replacing any die with defects. Moreover, as the first die 302 having the driving logic 308 is completely compatible with the standard CMOS process, the driving logic 308 can be fabricated using advanced process with small feature size to achieve complex circuit structures and low power consumption.

Figure 4A:
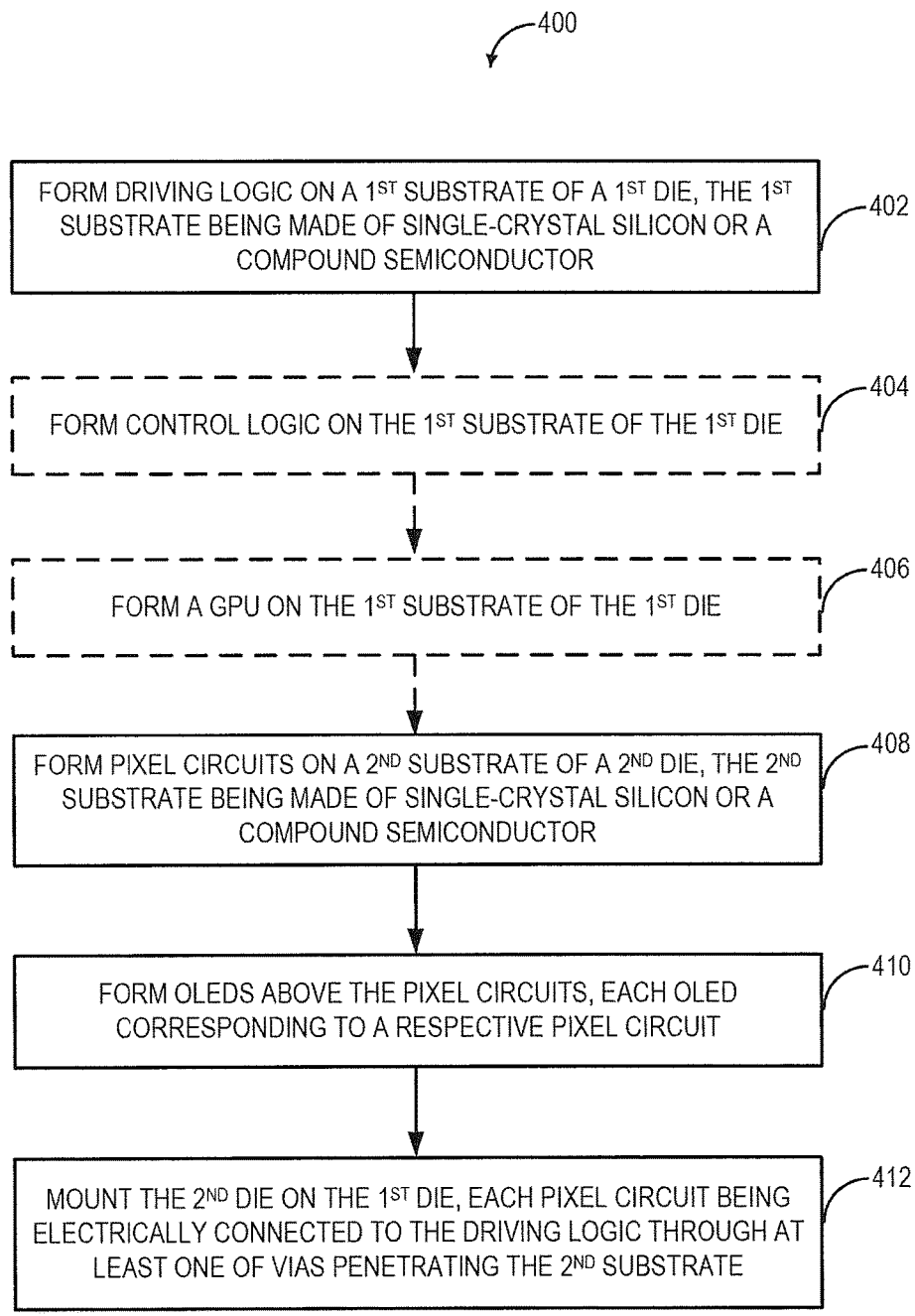
FIGS. 4A-4B are flow charts of a method for making the integrated OLED display apparatus in FIG. 3 in accordance with one embodiment set forth in the present disclosure.
Figure 4B:
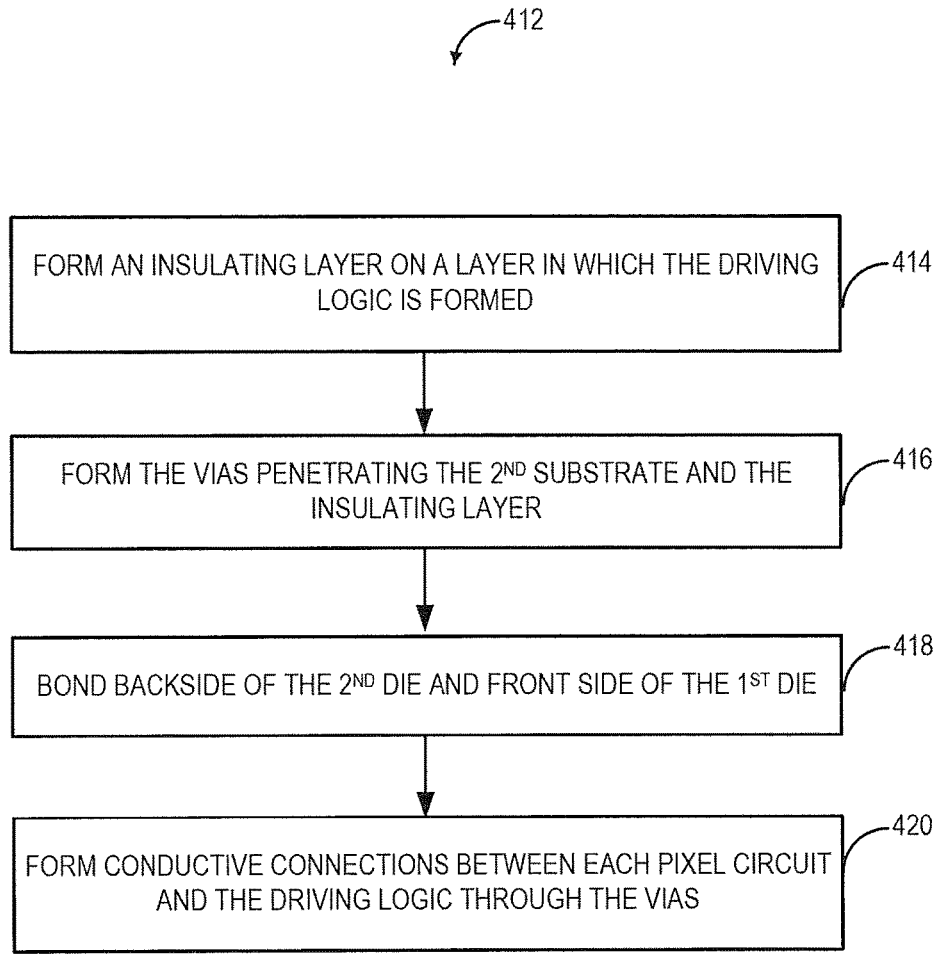

FIGS. 4A-4B are flow charts of a method for making the integrated OLED display apparatus 300 in FIG. 3 in accordance with one embodiment set forth in the present disclosure. In FIG. 4A, the process 400 starts at 402, where driving logic is formed on a first substrate of a first die. The first substrate is made of single-crystal silicon (e.g., a bulk Si substrate or a SOI substrate) or a compound semiconductor, such as GaAs. The driving logic may include a gate driver and a source driver. Optionally, at 404, control logic is formed in the same layer in which the driving logic is formed on the first substrate of the first die. The control logic may include, for example, a TCON, an interface, and a power supply circuit. Optionally, at 406, a GPU is formed in the same layer in which the driving logic and the control logic are formed on the first substrate of the first die. At 408, pixel circuits are formed on a second substrate of a second die. The second substrate is made of single-crystal silicon or a compound semiconductor, such as GaAs. At 410, OLEDs are formed above the pixel circuits. Each OLED corresponds to a respective pixel circuit. At 412, the second die having the pixel circuits and the OLEDs is mounted on the first die having the driving logic. Each pixel circuit is electrically connected to the driving logic through at least one of vias penetrating the second substrate of the second die. The plurality of pixel circuits and the driving logic may be formed using different semiconductor feature sizes.

In FIG. 4B, the process 412 of mounting the second die on the first die includes further processes 414-420. Starting at 414, an insulating layer is formed on the layer in which the driving logic is formed on the first substrate of the first die. The insulating layer may be made of $SiO_2$. At 416, vias penetrating the second substrate of the second die and the insulating layer of the first die are formed. The vias may be TSVs. At 418, the backside of the second die is bonded to the front side of the first die. At 420, conductive connections are formed between each pixel circuit and the driving logic through the vias.

Figure 5:
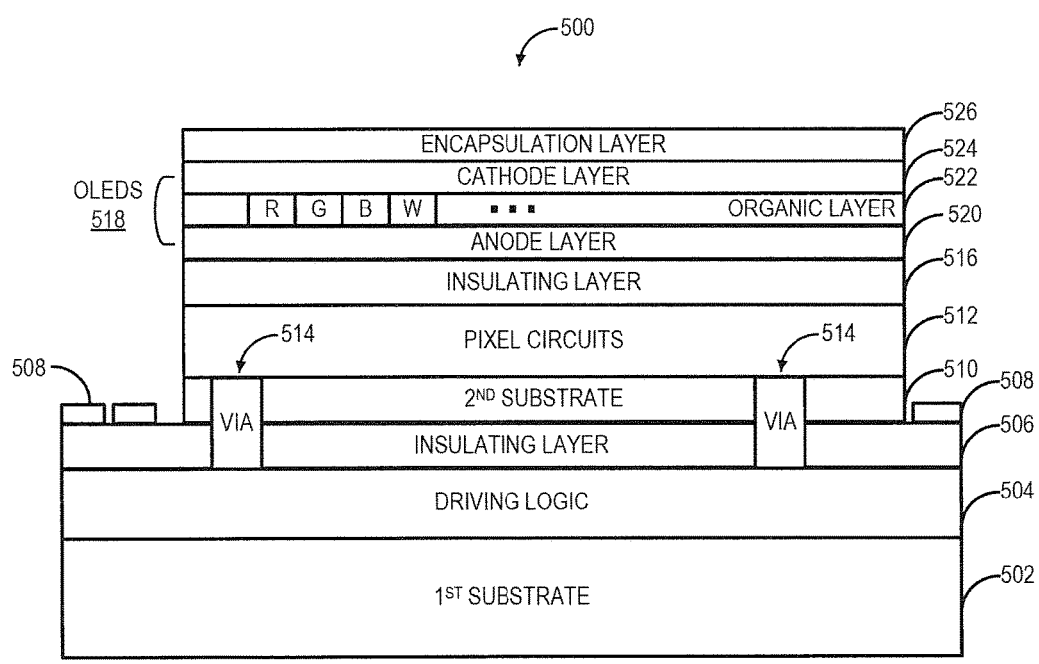
FIG. 5 is a side-view diagram illustrating another example of an integrated OLED display apparatus in accordance with one embodiment set forth in the present disclosure.

FIG. 5 is a side-view diagram illustrating another example of an integrated OLED display apparatus 500 in accordance with one embodiment set forth in the present disclosure. The integrated OLED display apparatus 500 in this example includes a first substrate 502, driving logic 504 on the first substrate 502, an insulating layer 506 on the layer in which the driving logic 504 is formed, a second substrate 510 on the insulating layer 506, pixel circuits 512 on the second substrate 510, another insulating layer 516 on the pixel circuits 512, OLEDs 518 on the other insulating layer 516, and an encapsulation layer 526 on the OLEDs 518. The first substrate 502 may be made of single-crystal silicon (e.g., a bulk Si substrate or a SOI substrate) or compound semiconductor material (e.g., GaAs), which has a higher mobility compared with LTPS material. The driving logic 504 may be the same driving logic 206 as described above in FIG. 2. In some embodiments, control logic 208 and/or a GPU 212 may be formed in the same layer in which the driving logic 504 is formed on the first substrate 502. The driving logic 504, control logic 208, and GPU 212 may include multiple sub-layers to achieve their functions as known in the art. In one example, the first substrate 502 may be a single-crystal silicon substrate, and the driving logic 504, control logic 208, and GPU 212 may be fabricated using the standard CMOS process including conventional UV lithography or next-generation lithography techniques such as extreme UV lithograph, electron beam lithography, X-ray lithography, etc. For example, the semiconductor feature size of the driving logic 504, control logic 208, and GPU 212 may be below 1 μm, such as 110 nm, 90 nm, 65 nm, 45 nm, 28 nm, 14 nm, 7 nm, etc. In this example, the insulating layer 506 covers the driving logic 504 to provide electrical insulation and protection for the driving logic 504 and may be made of $SiO_2$ or $Si_3N_4$. It is understood that the insulating layer 506 may be made of any other suitable materials when the material of the first substrate 502 is other than single-crystal silicon.

In this example, the second substrate 510 is deposited on the insulating layer 506. In this example, the second substrate is made of single-crystal silicon or compound semiconductor material (e.g., GaAs), which has a higher mobility compared with LTPS material. In other examples, the second substrate 510 may be made of LTPS or indium gallium zinc oxide (IGZO). The pixel circuits 512 are described above in FIG. 2 and include multiple sub-layers to achieve their functions as known in the art. In one example, the second substrate 510 may be a single-crystal silicon substrate, and the pixel circuits 512 may be fabricated using the standard CMOS process including conventional UV lithography or next-generation lithography techniques such as extreme UV lithograph, electron beam lithography, X-ray lithography, etc. For example, the semiconductor feature size of the pixel circuits 512 may be below 1 μm, such as 110 nm, 90 nm, 65 nm, 45 nm, 28 nm, 14 nm, 7 nm, etc. In another example in which the second substrate 510 is made of LTPS, the pixel circuits 512 may be fabricated using the conventional TFT process for making TFTs on glass substrates, and the semiconductor feature size of the pixel circuits 512 may be above 1 μm.

In this example, the insulating layer 516 covers the pixel circuits 512 to provide electrical insulation and protection for the pixel circuits 512 and may be made of $SiO_2$ or $Si_3N_4$. It is understood that the insulating layer 516 may be made of any other suitable materials when the material of the second substrate 510 is other than single-crystal silicon. OLEDs 518 may be formed in a sandwich structure having an anode layer 520, an organic layer 522, and a cathode layer 524, as known in the art. Each OLED 518 corresponds to a respective pixel circuit 512 as described above in FIG. 2. The anode layer 520 may be formed on the insulating layer 516. The anode for each OLED 518 may be patterned by lithography process. The organic layer 522 may be formed on the anode layer 520 and patterned for each OLED 518 by evaporation techniques using FMMs. Depending on the characteristics (e.g., material, structure, etc.) of the organic layer 522 of each OLED 518, the OLED 518 may present a distinct color and brightness. The cathode layer 524 may be formed on the organic layer 522. The cathode for each OLED 518 may be patterned by lithography process. In this example, the OLEDs 518 are top-emitting OLEDs, and the cathode layer 524 may be made of ITO. In this example, each OLED 518 is in a distinct color (e.g., red, green, blue, and white). In some embodiments, other OLED configurations may be applied. In one example, each OLED 518 may be in the same white color, and the color of each individual subpixel is defined by another layer of color filters in different colors (not shown). In another example, each OLED 518 may be in the same blue color, and the color of each individual subpixel is defined by another layer of transfer color filters in different colors (not shown).

In this example, each pixel circuit 512 is electrically connected to the driving logic 504 through at least one vias 514. In this example, the encapsulation layer 526 is formed on the OLEDs 518 to protect the OLEDs 518 after packaging. Contact pads 508 may be formed on the insulating layer 506 and electrically connected to the internal electrical components of the integrated OLED display apparatus 500, such as the driving logic 504, through vias (not shown).

In the example shown in FIG. 5, because the driving logic 504 and the pixel circuits 512 can be fabricated in a stacked configuration in the same die, the size of the die can be reduced, thereby improving wafer utilization.

Figure 6A:
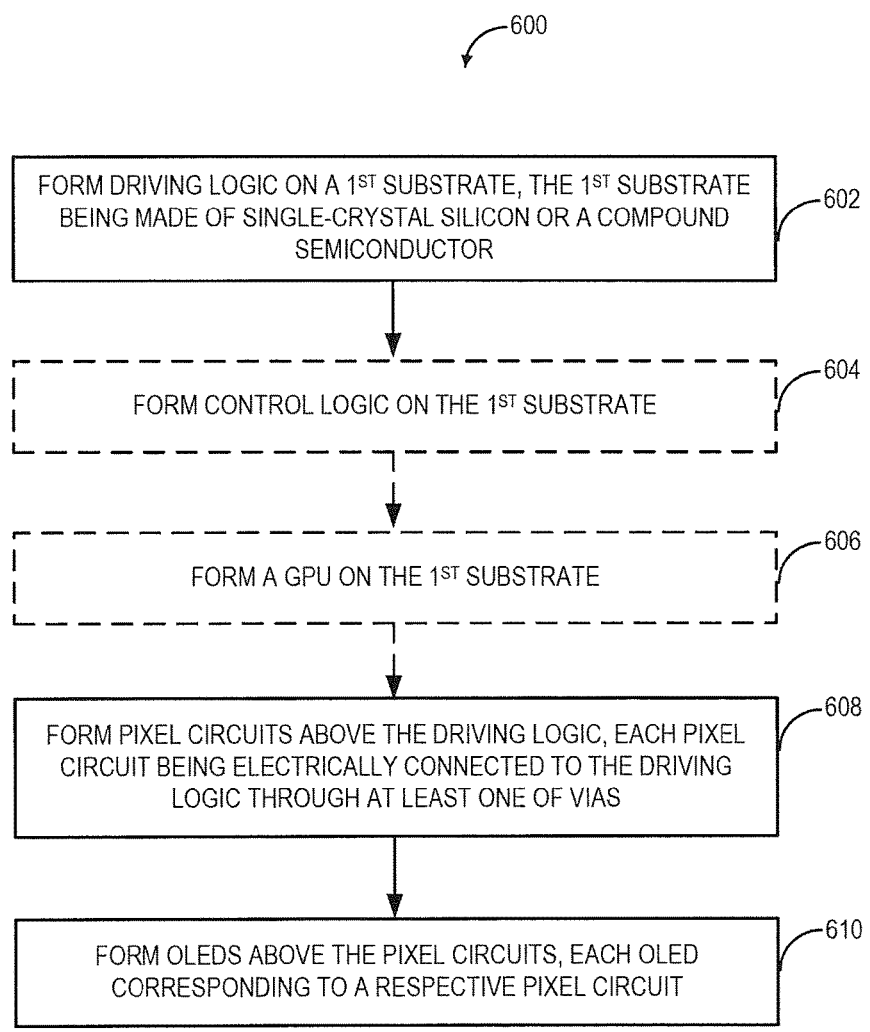
FIGS. 6A-6B are flow charts of a method for making the integrated OLED display apparatus in FIG. 5 in accordance with one embodiment set forth in the present disclosure.
Figure 6B:
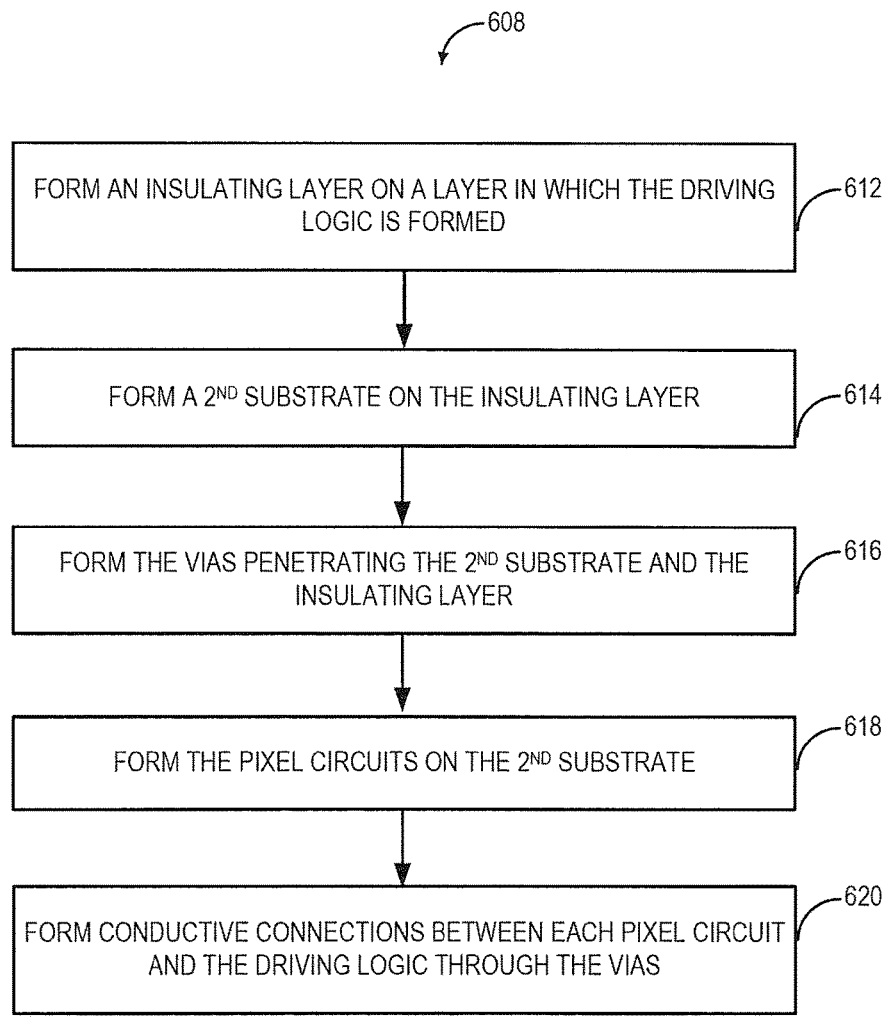

FIGS. 6A-6B are flow charts of a method for making the integrated OLED display apparatus 500 in FIG. 5 in accordance with one embodiment set forth in the present disclosure. In FIG. 6A, the process 600 starts at 602, where driving logic is formed on a first substrate. The first substrate is made of single-crystal silicon (e.g., a bulk Si substrate or a SOI substrate) or a compound semiconductor, such as GaAs. The driving logic may include a gate driver and a source driver. Optionally, at 604, control logic is formed in the same layer in which the driving logic is formed on the first substrate. The control logic may include, for example, a TCON, an interface, and a power supply circuit. Optionally, at 606, a GPU is formed in the same layer in which the driving logic and the control logic are formed on the first substrate. At 608, pixel circuits are formed above the driving logic. Each pixel circuit is electrically connected to the driving logic through at least one via. At 610, OLEDs are formed above the pixel circuits. Each OLED corresponds to a respective pixel circuit.

In FIG. 6B, the process 608 of forming the pixel circuits includes further processes 612-620. Starting at 612, an insulating layer is formed on the layer in which the driving logic is formed. At 614, a second substrate is formed on the insulating layer. The second substrate is made of single-crystal silicon or a compound semiconductor, such as GaAs. At 616, vias penetrating the second substrate and the insulating layer are formed. At 618, the pixel circuits are formed on the second substrate. At 620, conductive connections between each pixel circuit and the driving logic are formed through the vias.

Figure 7:
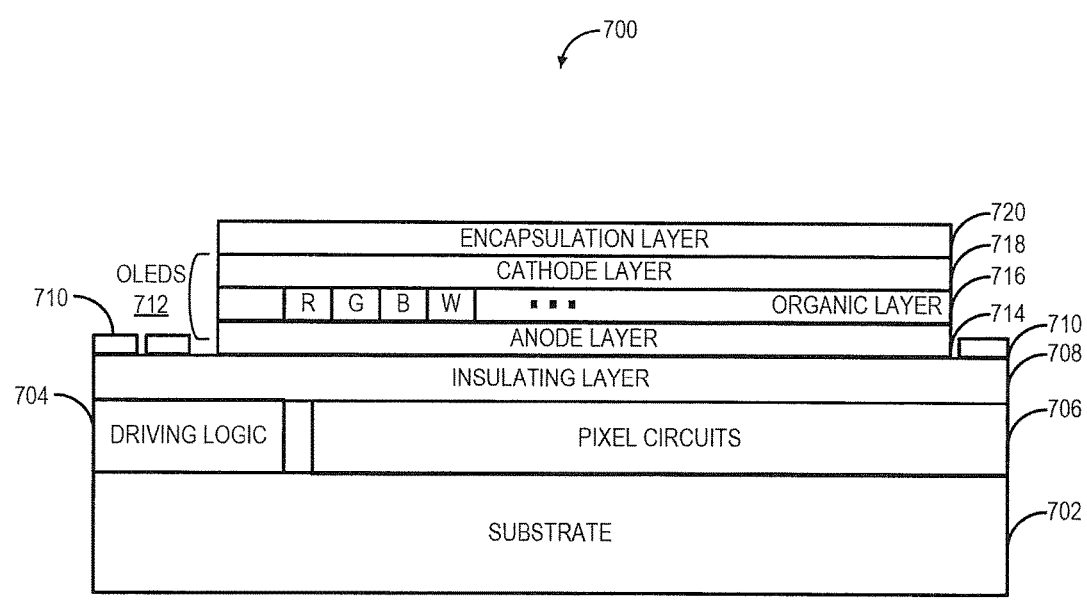
FIG. 7 is a side-view diagram illustrating still another example of an integrated OLED display apparatus in accordance with one embodiment set forth in the present disclosure.

FIG. 7 is a side-view diagram illustrating still another example of an integrated OLED display apparatus 700 in accordance with one embodiment set forth in the present disclosure. The integrated OLED display apparatus 700 in this example includes a substrate 702, driving logic 704 and pixel circuits 706 on the substrate 702, an insulating layer 506 on the layer in which the driving logic 704 and pixel circuits 706 are formed, OLEDs 712 on the insulating layer 708, and an encapsulation layer 720 on the OLEDs 712. The substrate 702 may be made of single-crystal silicon (e.g., a bulk Si substrate or a SOI substrate) or compound semiconductor material (e.g., GaAs), which has a higher mobility compared with LTPS material. The driving logic 704 may be the same driving logic 206 as described above in FIG. 2. In some embodiments, control logic 208 and/or a GPU 212 may be formed in the same layer in which the driving logic 704 and the pixel circuits 706 are formed on the substrate 702. The driving logic 704, pixel circuits 706, control logic 208, and GPU 212 may include multiple sub-layers to achieve their functions as known in the art. In one example, the substrate 702 may be a single-crystal silicon substrate, and the driving logic 704, pixel circuits 706, control logic 208, and GPU 212 may be fabricated using the standard CMOS process including conventional UV lithography or next-generation lithography techniques such as extreme UV lithograph, electron beam lithography, X-ray lithography, etc. For example, the semiconductor feature size of the driving logic 704, pixel circuits 706, control logic 208, and GPU 212 may be below 1 μm, such as 110 nm, 90 nm, 65 nm, 45 nm, 28 nm, 14 nm, 7 nm, etc. In this example, the insulating layer 708 covers the driving logic 704 and pixel circuits 706 to provide electrical insulation and protection for the driving logic 704 and pixel circuits 706 and may be made of $SiO_2$ or $Si_3N_4$. It is understood that the insulating layer 708 may be made of any other suitable materials when the material of the substrate 702 is other than single-crystal silicon.

In this example, OLEDs 712 may be formed in a sandwich structure having an anode layer 714, an organic layer 716, and a cathode layer 718, as known in the art. Each OLED 712 corresponds to a respective pixel circuit 706 as described above in FIG. 2. The anode layer 714 may be formed on the insulating layer 708. The anode for each OLED 712 may be patterned by lithography process. The organic layer 716 may be formed on the anode layer 714 and patterned for each OLED 712 by evaporation techniques using FMMs. Depending on the characteristics (e.g., material, structure, etc.) of the organic layer 716 of each OLED 712, the OLED 712 may present a distinct color and brightness. The cathode layer 718 may be formed on the organic layer 716. The cathode for each OLED 712 may be patterned by lithography process. In this example, the OLEDs 712 are top-emitting OLEDs, and the cathode layer 718 may be made of ITO. In this example, each OLED 712 is in a distinct color (e.g., red, green, blue, and white). In some embodiments, other OLED configurations may be applied. In one example, each OLED 712 may be in the same white color, and the color of each individual subpixel is defined by another layer of color filters in different colors (not shown). In another example, each OLED 712 may be in the same blue color, and the color of each individual subpixel is defined by another layer of transfer color filters in different colors (not shown).

In this example, the encapsulation layer 720 is formed on the OLEDs 712 to protect the OLEDs 712 after packaging. Contact pads 710 may be formed on the insulating layer 708 and electrically connected to the internal electrical components of the integrated OLED display apparatus 700, such as the driving logic 704 and pixel circuits 706, through vias (not shown).

Figure 8A:
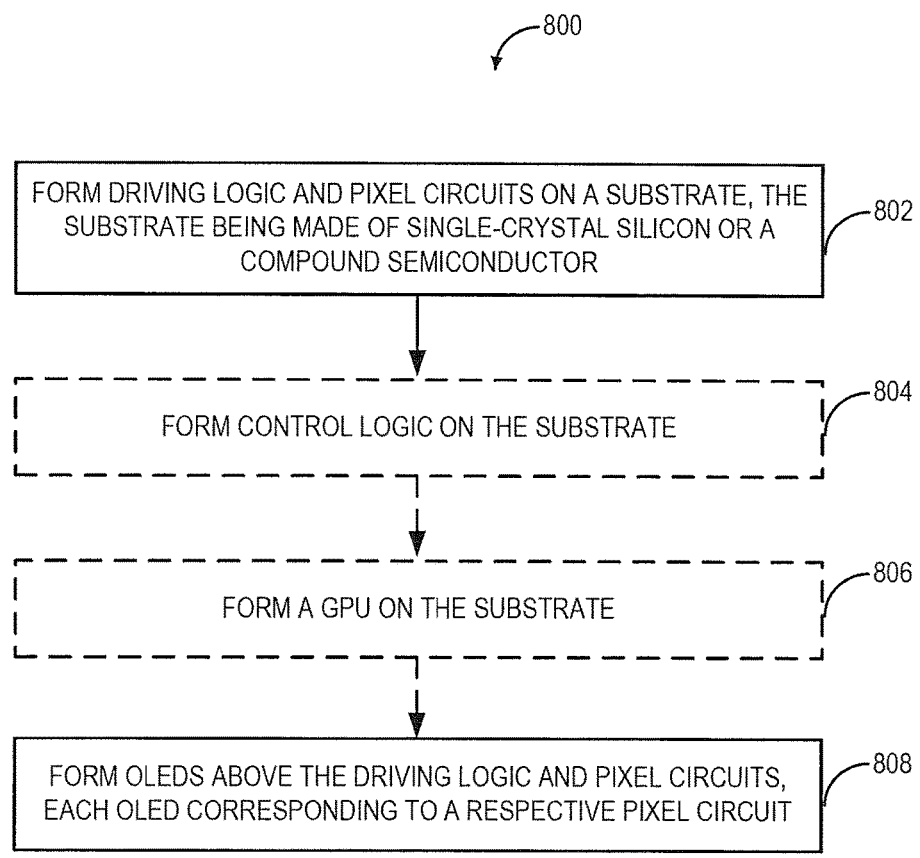
FIGS. 8A-8B are flow charts of a method for making the integrated OLED display apparatus in FIG. 7 in accordance with one embodiment set forth in the present disclosure.
Figure 8B:
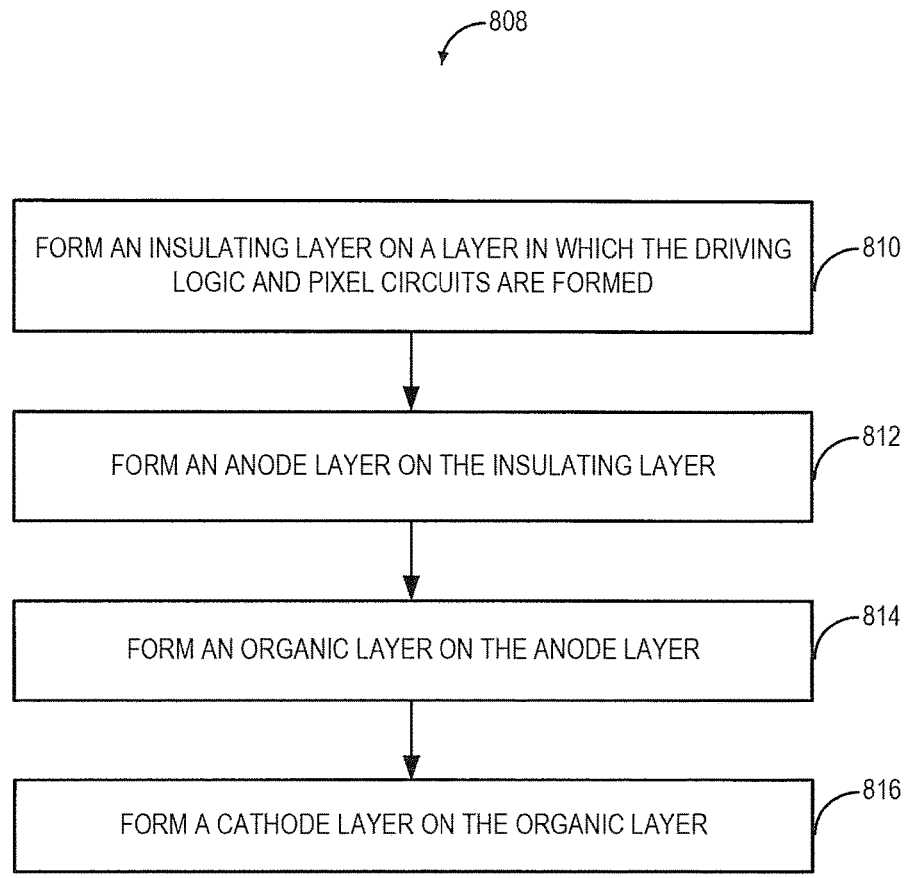

FIGS. 8A-8B are flow charts of a method for making the integrated OLED display apparatus 700 in FIG. 7 in accordance with one embodiment set forth in the present disclosure. In FIG. 8A, the process 800 starts at 802, where driving logic and pixel circuits are formed on a substrate. The substrate is made of single-crystal silicon (e.g., a bulk Si substrate or a SOI substrate) or a compound semiconductor, such as GaAs. The driving logic may include a gate driver and a source driver. Optionally, at 804, control logic is formed in the same layer in which the driving logic and pixel circuits are formed on the substrate. The control logic may include, for example, a TCON, an interface, and a power supply circuit. Optionally, at 806, a GPU is formed in the same layer in which the driving logic, the pixel circuits, and the control logic are formed on the substrate. At 808, OLEDs are formed above the layer in which the driving logic and pixel circuits are formed. Each OLED corresponds to a respective pixel circuit.

In FIG. 8B, the process 808 of forming the OLEDs includes further processes 810-816. Starting at 810, an insulating layer is formed on the layer in which the driving logic and pixel circuits are formed. At 812, an anode layer is formed on the insulating layer. At 814, an organic layer is formed on the anode layer. At 816, a cathode layer is formed on the organic layer.

Also, integrated circuit design systems (e.g. work stations) are known that create wafers with integrated circuits based on executable instructions stored on a computer-readable medium such as but not limited to CDROM, RAM, other forms of ROM, hard drives, distributed memory, etc. The instructions may be represented by any suitable language such as but not limited to hardware descriptor language (HDL), Verilog or other suitable language. As such, the logic, units, and circuits described herein may also be produced as integrated circuits by such systems using the computer-readable medium with instructions stored therein.

For example, an integrated circuit with the aforedescribed logic, units, and circuits may be created using such integrated circuit fabrication systems. The computer-readable medium stores instructions executable by one or more integrated circuit design systems that causes the one or more integrated circuit design systems to design an integrated circuit. In one example, the designed integrated circuit includes driving logic on a first substrate of a first die, a plurality of pixel circuits on a second substrate of a second die, and a plurality of OLEDs above the plurality of pixel circuits. The first substrate is made of single-crystal silicon or a compound semiconductor. The second substrate is made of single-crystal silicon or a compound semiconductor. Each of the plurality of OLEDs corresponds to a respective one of the plurality of pixel circuits. The second die having the driving logic is mounted on the first die having the plurality of pixel circuits and OLEDs. Each of the plurality of pixel circuits is electrically connected to the driving logic through at least one of a plurality of vias penetrating the second substrate of the second die. In another example, the designed integrated circuit includes driving logic on a first substrate, a plurality of pixel circuits above the driving logic, and a plurality of OLEDs above the plurality of pixel circuits. The first substrate is made of single-crystal silicon or a compound semiconductor. Each of the plurality of pixel circuits is electrically connected to the driving logic through at least one of a plurality of vias. Each of the plurality of OLEDs corresponds to a respective one of the plurality of pixel circuits. In still another example, the designed integrated circuit includes driving logic and a plurality of pixel circuits in a same layer on a substrate and a plurality of OLEDs above the layer in which the driving logic and the plurality of pixel circuits are formed. The substrate is made of single-crystal silicon or a compound semiconductor. Each of the plurality of OLEDs corresponds to a respective one of the plurality of pixel circuits.

The above detailed description of the disclosure and the examples described therein have been presented for the purposes of illustration and description only and not by limitation. It is therefore contemplated that the present disclosure cover any and all modifications, variations or equivalents that fall within the spirit and scope of the basic underlying principles disclosed above and claimed herein.

What is claimed is:

1. A method for making a display device, comprising:
   forming driving logic on a first substrate of a first die, wherein the first substrate is made of single-crystal silicon;
   forming a plurality of pixel circuits on a second substrate of a second die, wherein the second substrate is made of single-crystal silicon;
   forming a plurality of organic light emitting diodes (OLEDs) above the plurality of pixel circuits, wherein each of the plurality of OLEDs corresponds to a respective one of the plurality of pixel circuits; and
   mounting the second die having the plurality of pixel circuits and OLEDs on the first die having the driving logic, wherein each of the plurality of pixel circuits is electrically connected to the driving logic through at least one of a plurality of vertical interconnect accesses (vias) penetrating the second substrate of the second die.

2. The method of claim 1, further comprising:
   forming control logic in a same layer in which the driving logic is formed.

3. The method of claim 2, wherein
   the driving logic comprises a gate driver and a source driver; and
   the control logic comprises a timing controller (TCON), an interface, and a power supply circuit.

4. The method of claim 2, further comprising:
   forming a graphic processing unit (GPU) in the same layer in which the driving logic and the control logic are formed.

5. The method of claim 1, wherein mounting the second die having the driving logic on the first die having the plurality of pixel circuits and OLEDs comprises:
   forming an insulating layer on a layer in which the driving logic is formed;
   forming the plurality of vias penetrating the second substrate of the second die and the insulating layer;
   bonding the back side of the second die and the front side the first die; and
   forming conductive connections between each of the plurality of pixel circuits and the driving logic through the plurality of vias.

6. The method of claim 1, wherein the plurality of pixel circuits and the driving logic are formed using different semiconductor feature sizes.

7. An apparatus comprising:
   driving logic on a first substrate of a first die;
   a plurality of pixel circuits on a second substrate of a second die; and
   a plurality of organic light emitting diodes (OLEDs) above the plurality of pixel circuits, wherein
   the first substrate is made of single-crystal silicon;
   the second substrate is made of single-crystal silicon;
   each of the plurality of OLEDs corresponds to a respective one of the plurality of pixel circuits,
   the second die having the plurality of pixel circuits and OLEDs is mounted on the first die having the driving logic, and
   each of the plurality of pixel circuits is electrically connected to the driving logic through at least one of a plurality of vertical interconnect accesses (vias) penetrating the second substrate of the second die.

8. The apparatus of claim 7, further comprising:
   control logic in a same layer in which the driving logic is formed.

9. The apparatus of claim 8, wherein
   the driving logic comprises a gate driver and a source driver; and
   the control logic comprises a timing controller (TCON), an interface, and a power supply circuit.

10. The apparatus of claim 8, further comprising:
    a graphic processing unit (GPU) in the same layer in which the driving logic and the control logic are formed.

11. A method for making a display device, comprising:
    forming driving logic on a first substrate, wherein the first substrate is made of single-crystal silicon;
    forming a plurality of pixel circuits above the driving logic, wherein each of the plurality of pixel circuits is electrically connected to the driving logic through at least one of a plurality of vertical interconnect accesses (vias); and
    forming a plurality of organic light emitting diodes (OLEDs) above the plurality of pixel circuits, wherein each of the plurality of OLEDs corresponds to a respective one of the plurality of pixel circuits.

12. The method of claim 11, further comprising:
    forming control logic in a same layer in which the driving logic is formed.

13. The method of claim 12, wherein
    the driving logic comprises a gate driver and a source driver; and
    the control logic comprises a timing controller (TCON), an interface, and a power supply circuit.

14. The method of claim 12, further comprising:
    forming a graphic processing unit (GPU) in the same layer in which the driving logic and the control logic are formed.

15. The method of claim 11, wherein forming a plurality of pixel circuits comprises:
    forming an insulating layer on a layer in which the driving logic is formed;
    forming a second substrate on the insulating layer;
    forming the plurality of vias penetrating the insulating layer and the second substrate;
    forming the plurality of pixel circuits on the second substrate; and
    forming conductive connections between each of the plurality of pixel circuits and the driving logic through the plurality of vias.

16. The method of claim 15, wherein the second substrate is made of single-crystal silicon.

17. An apparatus comprising:
driving logic on a first substrate, wherein the first substrate is made of single-crystal silicon;
a plurality of pixel circuits above the driving logic, wherein each of the plurality of pixel circuits is electrically connected to the driving logic through at least one of a plurality of vertical interconnect accesses (vias); and
a plurality of organic light emitting diodes (OLEDs) above the plurality of pixel circuits, wherein each of the plurality of OLEDs corresponds to a respective one of the plurality of pixel circuits.

18. The apparatus of claim 17, further comprising:
control logic in a same layer in which the driving logic is formed.

19. The apparatus of claim 18, wherein
the driving logic comprises a gate driver and a source driver; and
the control logic comprises a timing controller (TCON), an interface, and a power supply circuit.

20. The apparatus of claim 18, further comprising:
a graphic processing unit (GPU) in the same layer in which the driving logic and the control logic are formed.

21. A method for making a display device, comprising:
forming driving logic and a plurality of pixel circuits in a same layer on a substrate, wherein the substrate is made of single-crystal silicon; and
forming a plurality of organic light emitting diodes (OLEDs) above the layer in which the driving logic and the plurality of pixel circuits are formed, wherein each of the plurality of OLEDs corresponds to a respective one of the plurality of pixel circuits.

22. The method of claim 21, further comprising:
forming control logic in the same layer in which the driving logic and the plurality of pixel circuits are formed.

23. The method of claim 22, wherein
the driving logic comprises a gate driver and a source driver; and
the control logic comprises a timing controller (TCON), an interface, and a power supply circuit.

24. The method of claim 22, further comprising:
forming a graphic processing unit (GPU) in the same layer in which the driving logic, the plurality of pixel circuits, and the control logic are formed.

25. The method of claim 21, wherein forming a plurality of OLEDs comprises:
forming an insulating layer on the layer in which the driving logic and the plurality of pixel circuits are formed;
forming an anode layer on the insulating layer;
forming an organic layer on the anode layer; and
forming a cathode layer on the organic layer.

26. The method of claim 21, wherein the driving logic and a plurality of pixel circuits are formed using a complementary metal-oxide-semiconductor (CMOS) fabrication process.

27. An apparatus comprising:
driving logic and a plurality of pixel circuits in a same layer on a substrate, wherein the substrate is made of single-crystal silicon; and
a plurality of organic light emitting diodes (OLEDs) above the layer in which the driving logic and the plurality of pixel circuits are formed, wherein each of the plurality of OLEDs corresponds to a respective one of the plurality of pixel circuits.

28. The apparatus of claim 27, further comprising:
control logic in a same layer in which the driving logic and the plurality of pixel circuits are formed.

29. The apparatus of claim 28, wherein
the driving logic comprises a gate driver and a source driver; and
the control logic comprises a timing controller (TCON), an interface, and a power supply circuit.

30. The apparatus of claim 28, further comprising:
a graphic processing unit (GPU) in the same layer in which the driving logic, the plurality of pixel circuits, and the control logic are formed.

* * * * *